April 18, 1950 J. G. BEARD 2,504,293

FREQUENCY CONTROL

Filed Jan. 25, 1945 3 Sheets-Sheet 1

INVENTOR.
Joseph G. Beard
BY H. S. Grover
ATTORNEY

April 18, 1950 J. G. BEARD 2,504,293
FREQUENCY CONTROL
Filed Jan. 25, 1945 3 Sheets-Sheet 2

INVENTOR.
Joseph G. Beard
BY
H. S. Grover
ATTORNEY

INVENTOR.
Joseph G. Beard
BY H. S. Grover
ATTORNEY

Patented Apr. 18, 1950

2,504,293

UNITED STATES PATENT OFFICE 2,504,293

FREQUENCY CONTROL

Joseph G. Beard, Haddonfield, N. J., assignor to Radio Corporation of America, a corporation of Delaware Application January 25, 1945, Serial No. 574,454

5 Claims. (Cl. 250—36)

This application discloses a new and improved method of and means for maintaining the frequency of an oscillation generator substantially constant. The oscillator may be of any size and may be the oscillation generator of a transmitter, referred to sometimes as a master oscillator, or the oscillation generator of a heterodyning circuit such as used in receivers, or may be a master oscillator used in industrial applications such as for heating purposes. Moreover, the method and means of the present invention may be applied to tuning any circuit wherein alternating current is induced.

The broad object of my invention is improved stabilization of generated wave energy.

In describing my invention and in the sake of brevity, reference will be made to oscillation generators for industrial use. One of the problems which will need to be solved for industrial oscillators is maintenance of the generated frequency within prescribed limits. In fact, it is believed that legislation will soon be enacted which will definitely limit the amount of frequency deviation from an assigned value, allowed for this service. The figure of $\pm.1\%$ has been suggested.

In the highly competitive field of radio frequency generator manufacture for the industrial heating of dielectrics it is felt that the cost of building a stable master oscillator power amplifier arrangement, or to supply a chain of amplifiers excited from a crystal oscillator would be prohibitive. Hence any method or means by which the frequency of a generator (otherwise unstable) may be held within narrow limits is of first importance.

A more specific object of the present invention is provision of a master oscillator with means for holding the frequency of operation thereof within narrow limits. The method and means of the present invention have been tested and have proven to be adequate for the purpose required.

The above objects and others the nature of which will appear hereinafter are attained by the use of a master oscillator with an automatic frequency control system therefor wherein two discriminator circuits, one of which has a sharp frequency versus voltage characteristic and the other of which has a broad frequency versus voltage characteristic are provided. These discriminators each include detectors which supply control potentials, used together to retune the master oscillator to correct its mean frequency. In this system, then, the discriminator with the sharp or narrow frequency versus voltage characteristic under usual conditions maintains the oscillator within a very narrow range of frequencies. If for some reason the oscillator has deviated from its assigned mean frequency a considerable amount, then the discriminator with the broad frequency versus voltage characteristic will bring the oscillation generator back within the range covered by the discriminator having the sharp frequency versus voltage characteristic, at which point the latter mentioned discriminator takes over and again holds the oscillation generator within narrow limits during usual operation.

As stated above, both discriminators supply potentials for automatic frequency control, and an object of my invention is improved use of these control potentials for the purpose intended. This object is attained by providing a bridge circuit at least one branch or arm of which includes a tube impedance which is controlled by the combined potentials from the discriminators. The bridge is unbalanced in a sense or direction depending on the direction of deviation of the master oscillator from its assigned frequency and this unbalance sets up currents or potentials used to retune the master oscillator.

A further object of the invention is a circuit actuated by the discriminator detector potentials which will operate properly in the presence of direct current voltage changes and during the time the tube in the bridge described above is warming up. In a preferred embodiment I provide a bridge wherein the two arms each include a tube output impedance which impedances vary in the presence of direct current voltage changes and during the warm-up period in like manner so that the bridge is always balanced and symmetrical in operation.

In describing my invention in detail reference will be made to the attached drawings wherein Fig. 1 illustrates by block diagram the essential features of a stabilized generator arranged in accordance with my invention;

Fig. 4 illustrates details of the essential circuit elements of a frequency stabilizing system arranged in accordance with my invention; while

Figure 1:
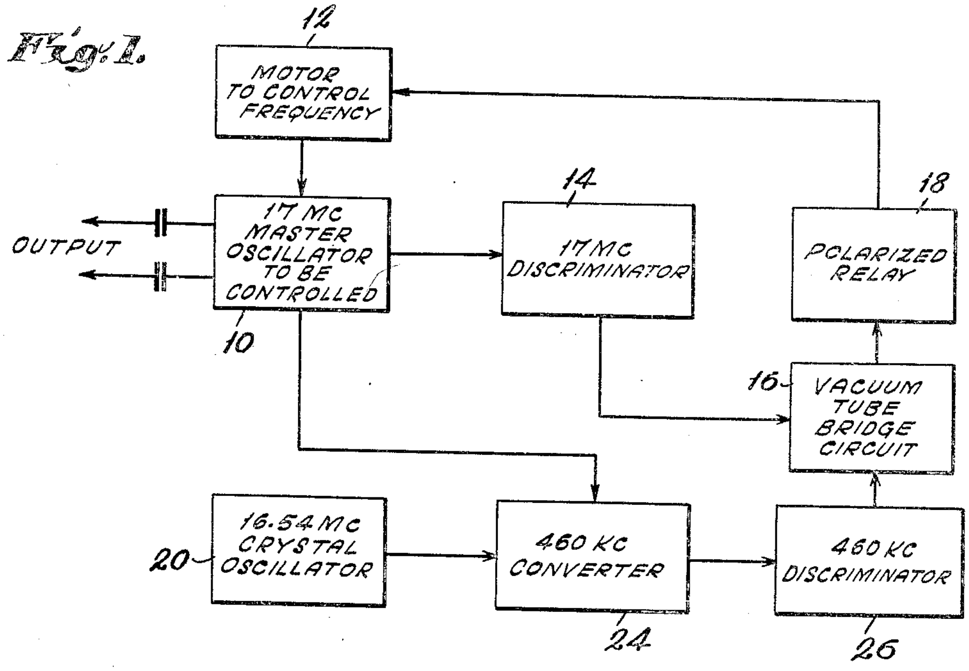

Referring to the block diagram of Fig. 1, 10 represents an oscillator such as a master oscillator of the type described above, operating to produce oscillations of a desired frequency for use. The oscillator may have the usual output connections. The master oscillator in 10 in an embodiment that worked well, operated at 17 megacycles, but may operate at any frequency. A frequency of operation is assigned here to expedite explanation of the invention. This master oscillator 10, the frequency of which is to be controlled by means such as for example a reactance tube or a motor tuning unit 12, feeds energy directly at its frequency of operation of a discriminator in unit 14. The discriminator in 14 may be of the Conrad type (Conrad Patent #2,057,640), or of the Seeley type (Seeley Patent #2,121,103). The reactance tube control in unit 12 may be as disclosed in Crosby Patent #2,279,-659, or a motor control such as illustrated in detail in Fig. 4 may be used.

Figure 2:
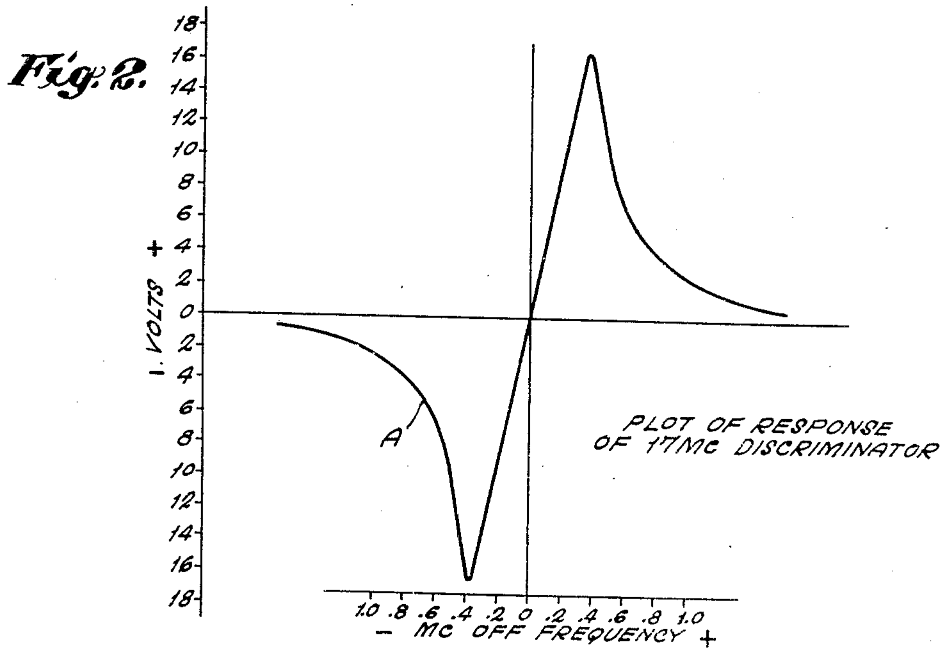
Figs. 2 and 3 illustrate graphically the frequency versus voltage characteristics of the discriminators.
Figure 4:
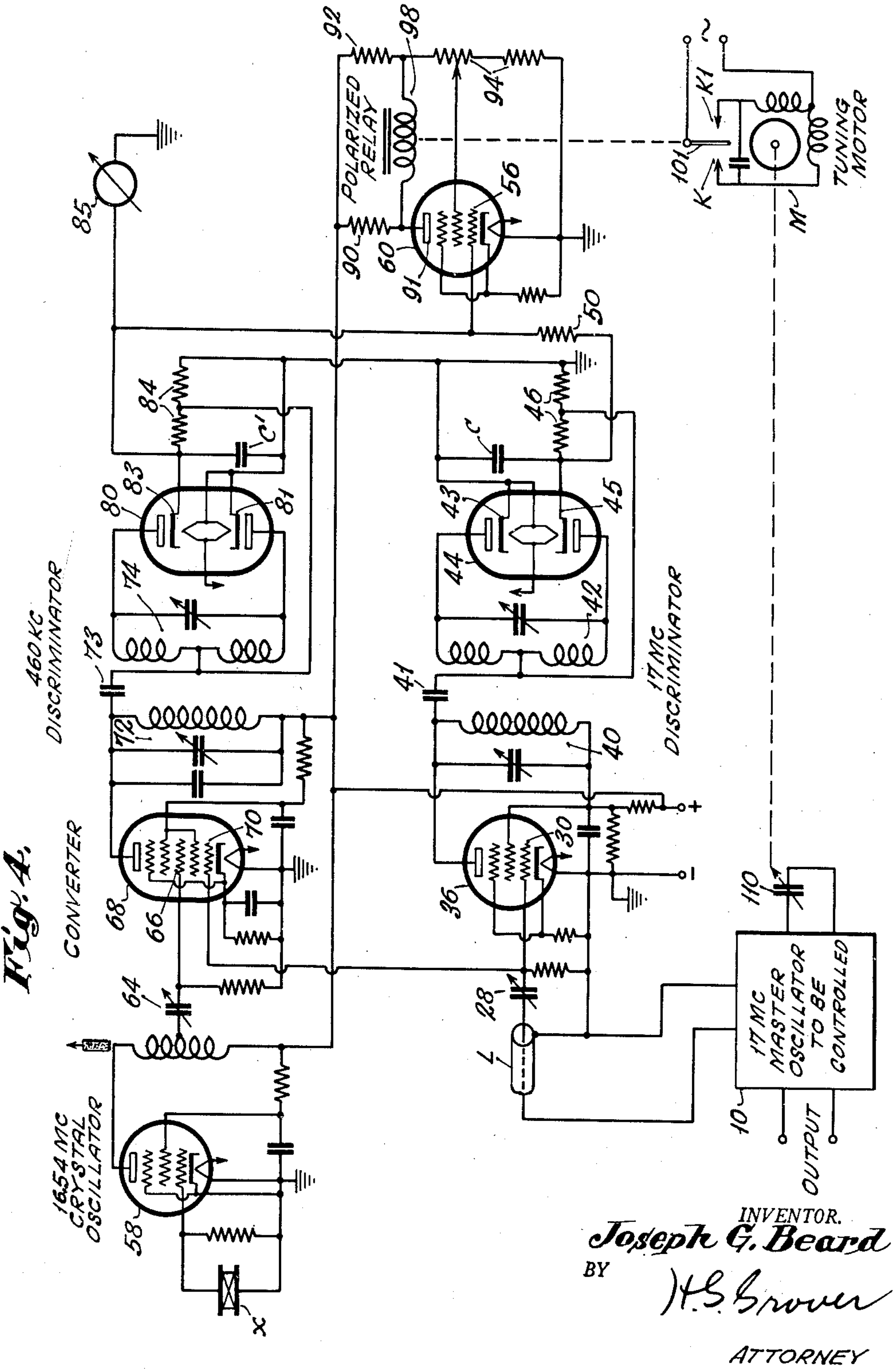

In the embodiment illustrated in detail, Fig. 4, a Seeley type of discriminator and detector is shown and as is known this discriminator operating at say 17 megacycles has a frequency versus voltage characteristic as shown in Fig. 2 of the drawings. It can be seen from the curve of Fig. 2 that whenever the frequency of the oscillator in 10 of Fig. 1 feeding this discriminator is above 17 megacycles the output voltage will be positive, and whenever the frequency supplied by the oscillator to the discriminator is less than 17 megacycles the output voltage will be negative. This direct current output voltage is impressed on a direct current bridge circuit in unit 16 of Fig. 1, described more in detail hereinafter. The bridge circuit in turn actuates a polarized relay in unit 18 to operate the motor in 12 to retune the master oscillator in 10. The direct current potential variations are so related to the frequency changes initiating the same that the motor in 12 is run in a direction to tend to prevent the frequency changes, and thereby reduce the output of the discriminator in 14 to a bias potential at which the motor is stationary. In the embodiment illustrated the bias potential is zero or thereabout.

This much of the system was found to work well without further equipment except that the frequency was dependent upon the stability of the discriminator circuit in 14. The temperature coefficient of this unit was found to be 50 parts per million per degree centigrade. This was considered too high and it was decided to use a crystal as a reference standard and to further improve the control system. To do this, a crystal controlled oscillator 20 has its output supplied to a converter in 24, to which a portion of the output of the master oscillator in 10 to be controlled is also supplied. In the embodiment operated the crystal oscillator in 20 had an output of 16.54 megacycles. This output may be derived directly from the crystal oscillator or the unit 20 may include multipliers. The converter shown in detail and described hereinafter had as one output side band currents of 460 kilocycles and these currents are fed to a discriminator 26 operating at 460 kilocycles. This discriminator like the discriminators in unit 14 may be of the Conrad or Seeley types, being of the Seeley type in the embodiment illustrated.

Figure 3:
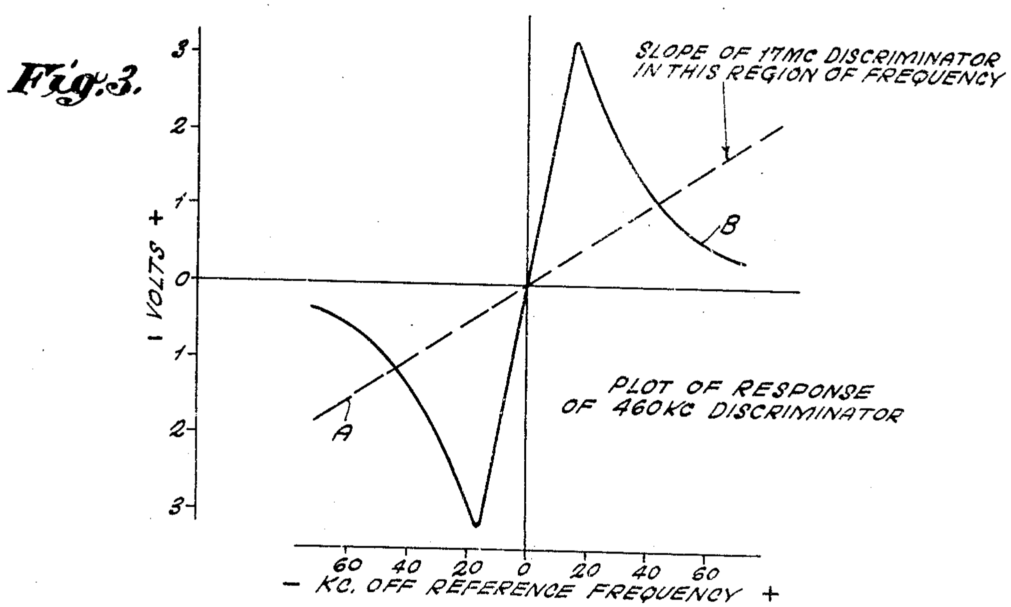

The discriminator in 26 has a frequency versus voltage characteristic as illustrated by curve B in Fig. 3, and when this frequency versus voltage characteristic is compared with the portion of the frequency versus voltage characteristic of the 17 megacycle discriminator in unit 14, shown by curve A of Fig. 3, it will be seen that the low frequency discriminator has a very sharp frequency versus voltage characteristic as compared to the corresponding characteristic of the 17 megacycle discriminator. The discriminator in 26, i. e., the sharp discriminator, produces a direct current output voltage corresponding to frequency variations of either the oscillator in 20 or the oscillator in 10. The magnitude of either of these sources of energy affects the output of the discriminator but this in no way affects the operation of the system since only variations in frequency at the reference frequency to which the discriminator is tuned, can change the sign of the direct current voltage output. It is the sign of this voltage which actuates the vacuum tube bridge circuit 16. To make certain that there will always be enough voltage to operate the vacuum tube bridge circuit 16, the tube in the converter 24 (tube 68, Fig. 4), and the tube 36 of Fig. 4, are operated as limiters by operating at reduced plate voltage and by the use of a high grid resistor. This will be discussed in detail hereinafter.

Note also that the dashed line A indicates the slope of the 17 megacycle discriminator in this frequency region, and that the slope thereof is not nearly as steep as the sloop of the characteristic B. Discriminator 26 then will provide at its output a positive direct current voltage when the frequency of the generator 10 goes in one direction, and a negative direct current voltage when the frequency of generator 10 swings in the other direction from its assigned frequency. This direct current voltage output of the 460 kilocycle discriminator 26 is fed to the vacuum tube bridge circuit 16 which actuates the frequency control as in the case of the output of the 17 megacycle discriminator. The frequency of the 17 megacycle oscillator in 10 is now controlled with reference to the 460 kc. discriminator, when it is near the frequency of the crystal and is controlled with reference to the 17 megacycle discriminator when it is beyond the range of the 460 kc. discriminator.

The purpose of using the 17 megacycle discriminator which has a broad characteristic is to get the master oscillator 10 to come within the range of control of the 460 kilocycle discriminator. In an oscillator used for industrial heating it is not uncommon to have frequency deviation as great as ± 10%, which is readily handled by the 17 megacycle discriminator. On the other hand, control within narrow limits is obtained by a sharper discriminator once the output is within the range thereof. The discriminator 26, operating at low frequency, inherently possesses a much sharper frequency discriminating characteristic. Moreover, in the heterodyning down process the mean frequency of the currents to be stabilized has been reduced, whereas the undesired deviations have not been reduced. This raises the percentage drift greatly. The frequency versus voltage characteristic of the discriminator in 26 then looks narrow or sharp to the currents fed thereto. This is illustrated by the graphs of the frequency versus voltage characteristics of the discriminators in Figs. 2 and 3.

In the embodiment illustrated in Fig. 4, the master oscillator in 10 feeds output through a line L and condenser 28 to the control grid 30 of a coupling and limiting and amplifying tube 36, the anode of which feeds into a tuned circuit 40, the inductance of which provides the primary winding of a transformer, the secondary winding of which is in a tuned circuit 42 coupled somewhat as disclosed in the above identified Seeley patent to a diode detector system 44. The tuned circuit 40 is also coupled more directly by condenser 41 to a point on the inductance of circuit 42 and thence to the anodes of the detectors in tube 44. The cathodes of the diodes are coupled by impedances 46 shunted by radio frequency bypass condenser C. The cathode 43 end of the resistances 46 is grounded, while the cathode 45 end of the resistances 46 is connected to the grid 56 of a tube 60. The discriminator operates in a well known manner to produce across the output impedances 46 and on resistance 50 direct current potentials which change above and below zero or ground potential as the frequency of the master oscillator in 10 swings with respect to its assigned frequency to which the discriminator circuits 40 and 42 are tuned.

As stated above, one end of the impedances is grounded while the other end thereof is connected by resistance 50 to the control grid 56 of a relay tube 60 connected in the bridge circuit mentioned above.

The reference frequency source including the crystal X in the grid circuit of a tube 58 the anode circuit of which includes an iron core inductance supplies oscillatory energy through coupling condenser 64 to the third grid 66 of a converter and limiting tube 68. This tube has its first grid 70 coupled by condenser 28 and line L to the master oscillator in 10. The crystal oscillator is of the type wherein the crystal is between the grid and cathode and the anode is tuned to a frequency above the crystal frequency. Such oscillators are well known in the art and a detailed description will not be given here. The lower side band is selected in the discriminator circuit 72, 73, and 74, connected with the anode of tube 68. This discriminator circuit is similar to the discriminator circuit described hereinbefore, and with the double detector 80 supplies across the impedances 84 potentials which vary with respect to about zero potential when the frequency of the master oscillator varies because these variations appear in the lower side band and operate through the discriminator and detector circuit 72, 73, 74, and 80, to produce the said potentials. Here the cathode 81 end of the resistances 84 is connected to ground and the cathode 83 end of these resistances is connected to the grid 56 of the relay tube 60.

The anode 91 of this tube 60 is in the bridge circuit mentioned above. This bridge circuit includes resistances 90, 92 and 94, a tap on which is connected to the screen grid in tube 60. A relay winding 98 is connected between the anode 91 of tube 60 and one terminal of resistance 92. A source of direct current potential is connected to the other end of resistance 92 and to the end of resistance 90 remote from the anode 91 of tube 60. The adjustment and element and source value is such that with zero potential on the grid 56 the current through tube 60 just balances the current through the resistances 92 and 94 which also shunt this direct current source. Under these circumstances the polarized relay winding 98 has both ends at the same direct current potential and no current flows therein. This holds the armature 101 in a neutral or central position. The armature 101 cooperates with two contacts K and K1 to close an alternating current circuit through one or the other windings of a motor M. The motor shaft is operated to drive a tuning reactance shown as a tuning condenser 110.

Now when the discriminators operate as described above, a potential is set up on the grid 56 which is about zero when the oscillator in 10 is operating at the proper frequency. If the oscillator frequency increases the potential on the grid 56 becomes say positive, and more current flows through the tube 60. This upsets the balance across winding 98 and the armature is moved in a direction to close an alternating current circuit through one of the motor windings to rotate the condenser 110. The contact closing action and the discriminator actions are so related that the motor now tunes the condenser 110 in a direction to decrease the frequency of the oscillator in 10 and bring it back to its normal frequency. When the frequency of the oscillator 10 decreases a negative potential is produced on the grid 56 and this operates through the bridge circuit to raise the frequency of the oscillator. It will be understood that the discriminators may be arranged to produce negative potential when the frequency of 10 increases, and positive potential when the frequency of 10 decreases. Then the operation of the armature by the winding 98 and the arrangements of the contacts K and K1 are such as to turn the motor in the proper direction to correct the frequency change.

To put the system in operation the 460 kilocycle discriminator primary circuit 72 is tuned to produce a maximum direct current output across say resistance 84, while holding the side band output of 460 kilocycles constant. A meter 85 may be added to measure this voltage. Then the secondary 74 of this discriminator is tuned for zero direct current output in this meter. The same adjustment is then applied to the 17 megacycle discriminator. The order of adjustment of the discriminators may be reversed. The discriminator outputs are then checked for polarity so that they are additive at the resistance 50 and on the grid 56. If the outputs are opposed the 460 kilocycle discriminator is tuned to the wrong side band.

Then the potentials on the electrodes of the tube 60 are adjusted so that the current through 90 is equal to the current through 92 with zero bias on the brid 56. The tap on the resistance 94 supplying voltage to the screen grid of tube 60 assists in obtaining this balance of currents in the bridge circuit. In establishing the zero direct current potential on the grid 56 and in referring to the same hereinbefore contact potential is disregarded.

Now when the system goes in operation the broad discriminator will tune the same when necessary into the range of the sharp discriminator and the same will take over and hold the frequency of operation within narrow limits.

The two tubes 36 and 68 in addition to acting respectively as coupling and converting tubes, also act as limiters. This improves the operation of the system materially. In the first place variations in amplitude of the inputs to the tubes are flattened out so that the discriminators are supplied with currents of constant peak amplitude. This limiting action flattens out peaks on both sides of center or zero of the frequency versus voltage characteristics of the discriminator circuits, thereby smoothing out the control action. The main thing is to make sure that these tubes are not overloaded, and that there is enough voltage to properly operate the tubes 44 and 80. In the circuits the usual cathode resistors shunted by condensers may be used with the usual grid leak or grid bias resistances. Limiting takes place due to the fact that the plate and screen voltage is low and this in combination with the proper bias produces limiting. The limiting circuits disclosed herein are conventional and utilize the principle disclosed on page 210 of Hund's Frequency Modulation text book published in 1942.

While applicant does not hereby intend to limit his circuit elements to particular values since obviously a wide range of circuit elements may be used, depending to a large extent upon the frequencies involved, in the embodiment tested using the frequencies discussed above, and the circuit contants listed below, the oscillator operating at 17 megacycles was to be maintained within limits of ± .1% deviation. The actual figure achieved is about ± 3000 cycles or ± .017%. For the effect of temperature it was found that such changes caused a 25 cycle variation per degree Centigrade at 17 megacycles, and this variation was though small enough to be neglected in practical application.

In oscillators used for industrial heating it is not uncommon to have a frequency deviation as great as ± 10% which is readily handled by the 17 megacycle discriminator. Small deviations are handled by the 460 kilocycle discriminator.

Figure 5:
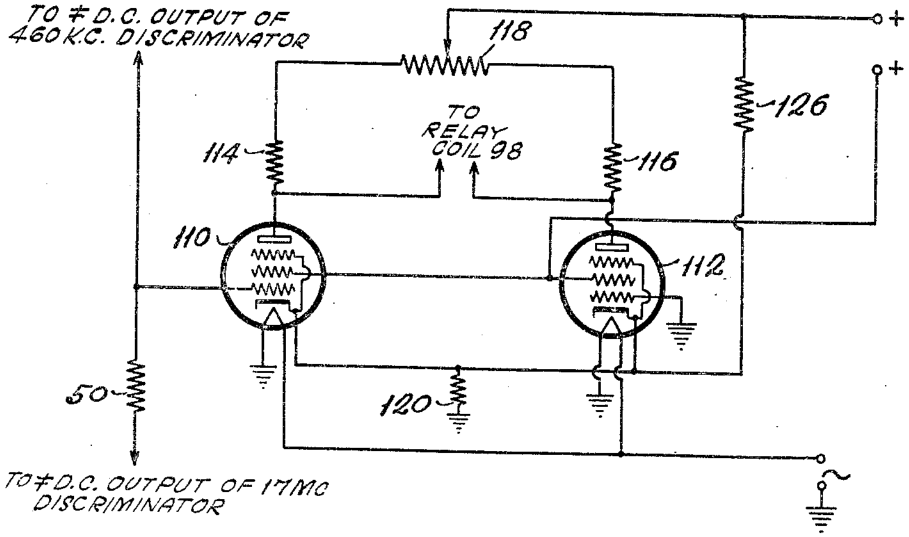
Fig. 5 illustrates a modification of the bridge circuit of Fig. 4.

In the embodiment tested tubes 36, 58 and 60 were type 6AG7, tube 68 was type 6SA7, tubes 44 and 80 were type 6H6. Impedance 46 comprised two 10,000 ohm resistances. Impedance 84 comprised two 100,000 ohm resistors. C. was .001 $\mu$f, while C' was .0001 $\mu$f. Resistances 90 and 92 were 3000 ohms. Resistance 94 comprised a potentiometer section of 5000 ohms and a fixed section of 11,000 ohms. The frequencies involved are given in the specification.

Where the bridge circuit is coupled by a single tube 60 into the outputs of the rectifiers 44 and 80 as in Fig. 4, a noticeable drift of the mean frequency of the master oscillator may take place during the warm-up period. This drift is due to unbalance of the bridge. The values of the balancing resistors 90, 92, 94 do not change but the resistance of the tube 60 does change as its cathode goes up to operating temperature. An additional object of my invention is to provide a relay between the two discriminators and the motor control circuits free of this defect. I have illustrated in Fig. 5 a modified circuit coupling the discriminators to the relay which controls the motor circuit. This bridge circuit includes two electron discharge devices 110 and 112 in a balanced bridge circuit which may be said to have two symmetrical halves, both of which vary in approximately the same manner during the warming-up process because the variables therein are balanced. In this bridge circuit the cathodes of tubes 110 and 112 warm up together so that the bridge remains balanced during the warm-up period.

More in detail, this bridge circuit comprises in addition to the tubes 110 and 112 resistors 114 and 116 coupling the anodes of the respective tubes to the terminals of a potentiometer 118. A point on the potentiometer 118 is connected to the positive terminal of the direct current source. The cathodes of the tubes and the suppressor grids are connected together and to ground by a cathode biasing resistor 120. One side of the bridge includes the output impedances of tube 110 in series with resistance 120, resistance 114 and part of resistance 118 across the direct current source. The other side comprises the output impedance of tube 112, resistances 120 and 116 and part of resistance 118. If the tube output impedances are about equal resistances 114 and 116 may be equal and small variations in tube impedances balanced by moving the tap on resistance 118. The two voltages from the two discriminators which vary about zero potential are supplied to the grid of tube 110 while the grid of the tube 112 is at ground or say zero potential. The current through the tube 110 depends in part upon the bias on its control grid as does the current through the tube 112. The bias on the control grid of the tube 110, however, varies above and below about zero potential in accordance with the output of the two discriminator circuits. The relay coil 98 is connected between the anodes of the tubes 110 and 112 and operates as described hereinbefore to run the motor M in one direction or the other depending on the direction of drift of the mean frequency of the master oscillator.

In the single tube circuit when the tube 60 is operating in a non-linear region, the balance point is sensitive to changes in the plate and screen supply voltage. In the two-tube embodiment the circuit is insensitive to changes in B supply since both tubes will be affected in the same manner and in equal amounts. The bridge is balanced as described above, and in connection with Fig. 4, and remains balanced during the warm-up period, since the two tubes are arranged symmetrically in the bridge circuit. Since the tubes use cathode bias a change in the plate supply voltage will change the bias. This change in bias will change the plate resistance of the tubes. In the single tube circuit this changes the balance point since the resistor arm current varies with the B volts while the tube arm current changes in accordance with changes in the cathode volts times the gain of the tube. Both arms of the two-tube bridge circuit are affected in equal manner by these changes, causing negligible shift in the balance point.

The purpose of the resistor 126 connected between the plus B and the cathodes of the two-tube circuit is to raise the bias thereon and thereby allow a smaller cathode resistor to be used at 120. A smaller cathode resistor makes possible a greater gain from the tubes which in turn makes the circuit more sensitive to control voltage on the grid of the first tube. Note that this resistance shunts the direct current source as well as part of both halves of the bridge and therefore does not destroy the balance thereof. In an embodiment which operated very well the tubes 110 and 112 were of the 6AC7 type, 114 and 116 were 47,000 ohm resistances, 118 was a 10,000 ohm potentiometer, 50 was a 56,000 ohm resistance, 126 was a 15,000 ohm resistance, the screen grids operated at +150 volts and the tap on resistance 118 was supplied with plus 250 volts D. C. 120 was a 56 ohm resistance.

What is claimed is:

1. In apparatus for stabilizing the frequency of a radio frequency generator having a tunable reactance as its frequency determining circuit, a source of oscillations of fixed frequency, a converter coupled to said source and said generator, a control motor having two windings and having a rotor connected to said tunable reactance, a first discriminator and detector coupled to said converter, a second discriminator and detector coupled to said generator, a relay having an armature actuating winding connected to a source of current and having two contacts connected to corresponding motor windings, and a tube having a control grid coupled to said discriminator detectors and having an output impedance coupled to said actuating winding for said armature.

2. In apparatus for changing the tuning of a circuit, including a variable reactance, when the frequency of wave energy therein changes, a crystal controlled oscillation generator, a first frequency selective circuit for deriving from said wave energy, currents the frequency of which changes when the frequency of said wave energy changes, a second frequency selective circuit including a converter for heterodyning oscillations from said oscillation generator with said wave energy for deriving from said wave energy currents the frequency of which changes when the frequency of said wave energy changes and the percentage change of which is greater than the percentage change in the wave energy, a first discriminator and detector coupled to said first selective circuit and tuned to the mean frequency of the currents derived thereby, a second discriminator and detector coupled to said second selective circuit and tuned to the frequency of the currents derived thereby, a two winding motor having a rotor actuating said variable reactance, a bridge circuit having impedance arms one of which comprises the output of an electron discharge device, a relay winding in the diagonal of said bridge, current supply circuits for the motor windings including contacts the positions of which are controlled by current in the relay winding, and means for controlling the conductivity of said device in accordance with the outputs of both discriminators and detectors.

3. Means for stabilizing the mean frequency of operation of a variable frequency current generator including a variable reactance, a heterodyning circuit excited by said current for deriving from said generated current alternating current the frequency of which varies when the frequency of said generated current varies and the percentage variation of which is higher than the percentage variation of said generated current, separate discriminators and detectors each having an output and having their inputs coupled respectively to the generator and to the heterodyning circuit to be excited respectively by the generated current and the derived current, a bridge circuit including two impedance arms and a diagonal including a magnetic winding, an electron discharge tube having the impedance between its output electrodes in one arm, a coupling between the detector outputs and the control grid of said tube, the arrangement being such that the bridge is balanced when the mean frequency of the generated current is as desired, and a two winding motor having its rotor connected to said variable reactance and its windings in current supply circuits including contacts operatively coupled to said magnetic winding.

4. In apparatus for changing the tuning of a circuit including a variable reactance when the frequency of wave energy therein changes, a source of oscillations of substantially fixed frequency, a combining stage coupled to said source and to said circuit to be excited by oscillations and wave energy to derive currents of lower frequency the frequency of which varies when the wave energy frequency changes, said variations being a greater percentage of the mean frequency of said currents than the corresponding variations in the frequency of said wave energy are of the mean frequency of said energy, a first frequency discriminator and detector coupled to said combining stage, a second frequency discriminator and detector coupled to said first-mentioned circuit, a combining circuit coupled to the outputs of said detectors, and means controlled by variations in the combined outputs for controlling said variable reactance in accordance with said combined output variations, said means comprising a bridge circuit having two impedance arms with substantially equal impedances therein, a source of direct current potential in shunt to said arms, a portion of the impedance in at least one of said arms being in the form of the output impedance of an electron discharge tube having a control grid coupled to said combining circuit, the arrangement being such that when said first-named circuit is tuned to the frequency of the wave energy therein, the potential applied by said combining circuit to said control grid balances the bridge, a relay winding connected between conjugate points on said bridge, and control apparatus coupled to said relay winding for controlling said variable reactance.

5. In apparatus for changing the tuning of a circuit including a variable reactance when the frequency of wave energy therein changes, a source of oscillations of substantially fixed frequency, a combining stage coupled to said source and to said circuit to be excited by oscillations and wave energy to derive currents of lower frequency the frequency of which varies when the wave energy frequency changes, said variations being a greater percentage of the mean frequency of said currents than the corresponding variations in the frequency of said wave energy are of the mean frequency of said energy, a first frequency discriminator and detector coupled to said combining stage, a second frequency discriminator and detector coupled to said first-mentioned circuit, a combining circuit coupled to the outputs of said detectors, and means controlled by variations in the combined outputs for controlling said variable reactance in accordance with said combined output variations, said means comprising a bridge circuit having two impedance arms each including the output impedance of a tube and a fixed impedance in series across a source of direct current potential, a control grid and an output electrode in each tube, a relay winding connected between the output electrodes of said tubes, a coupling between the control grid of one of said tubes and said combining circuit, the arrangement being such that when said first-named circuit is tuned to the frequency of the wave energy therein, the potential on said one control grid is such as to substantially balance said bridge whereby little or no current flows in said relay winding, and apparatus coupled to said relay winding for controlling said variable reactance.

JOSEPH G. BEARD.

REFERENCES CITED

The following references are of record in the file of this patent:

UNITED STATES PATENTS

| Number | Name | Date |
|---|---|---|
| 1,889,083 | Wintringham | Nov. 29, 1932 |
| 2,105,096 | Peterson | Jan. 11, 1938 |
| 2,112,504 | Mirfield | Mar. 29, 1938 |
| 2,116,435 | Kramer | May 3, 1938 |
| 2,156,534 | Hyland | May 2, 1939 |
| 2,173,902 | Gerth et al. | Sept. 26, 1939 |
| 2,284,266 | De Bellescize | May 26, 1942 |
| 2,308,620 | Lear | Jan. 19, 1943 |
| 2,410,817 | Ginzton | May 12, 1946 |